United States Patent
Mueller

(10) Patent No.: US 9,368,182 B2
(45) Date of Patent: Jun. 14, 2016

(54) MEMORY CELL

(71) Applicant: Fraunhofer-Gesellschaft zur Foerderung der angewandten Forschung e.V., Munich (DE)

(72) Inventor: Johannes Mueller, Dresden (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 14/564,212

(22) Filed: Dec. 9, 2014

(65) Prior Publication Data

US 2015/0162063 A1    Jun. 11, 2015

(30) Foreign Application Priority Data

Dec. 9, 2013   (EP) .................................... 13005712
Mar. 19, 2014  (DE) ........................ 10 2014 205 130

(51) Int. Cl.
| | |
|---|---|
| *G11C 11/22* | (2006.01) |
| *G11C 7/00* | (2006.01) |
| *G11C 14/00* | (2006.01) |
| *G11C 11/56* | (2006.01) |

(52) U.S. Cl.
CPC .......... *G11C 11/221* (2013.01); *G11C 11/2273* (2013.01); *G11C 14/0027* (2013.01); *G11C 14/0063* (2013.01); *G11C 11/22* (2013.01); *G11C 11/2275* (2013.01); *G11C 11/5657* (2013.01)

(58) Field of Classification Search
CPC .. G11C 11/22; G11C 11/221; G11C 11/2275; G11C 11/2273; G11C 11/5657

USPC .................... 365/145, 189.011, 65
See application file for complete search history.

(56) References Cited

U.S. PATENT DOCUMENTS

| | | | | |
|---|---|---|---|---|
| 5,297,077 | A * | 3/1994 | Imai ....................... | G11C 14/00 365/117 |
| 5,572,459 | A * | 11/1996 | Wilson ................... | G11C 11/22 365/145 |
| 5,600,587 | A | 2/1997 | Koike | |
| 5,910,911 | A * | 6/1999 | Sekiguchi .............. | G11C 11/22 365/145 |
| 2001/0019497 | A1* | 9/2001 | Shimada ................ | G11C 11/22 365/145 |
| 2004/0062071 | A1* | 4/2004 | Rodriguez ............. | G11C 11/22 365/145 |
| 2004/0240251 | A1* | 12/2004 | Nozawa ................. | G11C 11/22 365/145 |
| 2007/0053220 | A1* | 3/2007 | Gohou ................... | G11C 11/22 365/145 |
| 2014/0268483 | A1* | 9/2014 | Khan ..................... | G11C 11/22 361/301.1 |

FOREIGN PATENT DOCUMENTS

| | | |
|---|---|---|
| DE | 41 10 407 A1 | 10/1991 |
| DE | 696 12 676 T2 | 2/2002 |

* cited by examiner

*Primary Examiner* — Ly D Pham
(74) *Attorney, Agent, or Firm* — Keating & Bennett, LLP

(57) ABSTRACT

Nonvolatile storage with long memory endurance having the advantages of easy manufacturability is obtained by using a memory cell having an information storage element including a ferroelectric material, and operating the memory cell in a volatile operating mode and a nonvolatile operating mode. The option of operating the memory cell in the volatile operating mode enables the associated advantages of high memory speed at long endurance, wherein, however, the option of operating the memory cell in the nonvolatile operating mode can bridge gaps in the power supply.

13 Claims, 13 Drawing Sheets

MEMORY CELL

CROSS-REFERENCE TO RELATED APPLICATIONS

This application claims priority from European Patent Application No. 13 005 712.8, which was filed on Dec. 9, 2013, and from German Patent Application No 10 2014 205 130.4, which was filed on Mar. 19, 2014, which are both incorporated herein in their entirety by reference.

BACKGROUND OF THE INVENTION

The present invention relates to a memory cell and a memory comprising such a memory cell.

Volatile memories as SRAM, DRAM and embedded DRAM are essential building blocks of modern IC designs. They offer exceptional speed and endurance, but they are volatile memories and therefore rely on an external power supply to keep their memory state. If the power source is switched off, the memory state is lost.

Nonvolatile memories, such as flash memories, have reached maturity, but suffer from exceptionally low speed and endurance. Emerging nonvolatile memory concepts such as FeRAM, STT-MRAM, ReRAM, PC-RAM, etc. are very fast and are in principle capable of replacing DRMA and SRAM, but despite the fact that they have been researched for more than a decade, their limited endurance, scalability and manufacturability have prevented a breakthrough.

In order to combine high memory speed and easy manufacturability of, for example, SRAM technology with non-volatility, it is possible to add additional nonvolatile components to conventional volatile memories, such as an SRAM, in order to prevent data loss for example at scheduled power off or even unscheduled, for example, emergency off. This can be obtained, for example, by adding an additional nonvolatile memory, i.e. an NVM element to a volatile memory, i.e. a NV-SRAM is generated, a combination of a conventional SRAM and a SONOS cell.

FIG. 18 shows an example of a nonvolatile memory structure according to the just sketched option. The combination of an NVM memory with a fast and enduring volatile memory is converted, according to FIG. 18, to an NV-SRAM, a combination of a conventional 6T-SRAM cell with a flash memory cell as distributed, for example, by ANVO Systems. However, due to the incorporation of an additional NVM element, the memory density deteriorates enormously. Additional circuitry and power supply control with emergency high energy storage capacitors exemplarily exists as a further component of the NV-SRAM concept in the case of FIG. 18 in order to restore the SRAM cell into the allocated flash memory cell in case of an emergency.

The solution presented in FIG. 18, however, necessitates additional chip area and integration effort in the form of, for example, additional process steps or an additional lithography step.

SUMMARY

An embodiment may have a memory cell having an information storage element including a ferroelectric material, wherein the memory cell includes a volatile operating mode and a nonvolatile operating mode, wherein the memory cell is implemented to use, in the nonvolatile operating mode, an operating voltage across the information storage element that is increased with respect to the volatile operating mode, such that in the nonvolatile operating mode, an electric coercive field strength of the ferroelectric material is exceeded, and in the volatile operating mode, the electric coercive field strength of the ferroelectric material is not exceeded, or the operating voltage across the information storage element in the nonvolatile operating mode results in a saturated polarization hysteresis and in the volatile operating mode only in an unsaturated polarization hysteresis.

Another embodiment may have a memory with an inventive memory cell, wherein the memory is implemented to switch, in response to a trigger event, from the volatile operating mode into the nonvolatile operating mode and to save a state stored in the volatile operating mode in the nonvolatile operating mode.

Another embodiment may have a method for operating a memory cell, which includes an information storage element which includes a ferroelectric material, wherein the method includes an operation of the memory cell in a volatile operating mode and an operation of the memory cell in a nonvolatile operating mode, wherein, in the nonvolatile operating mode, an operating voltage across the information storage element that is increased with respect to the volatile operating mode is used, such that in the nonvolatile operating mode, an electric coercive field strength of the ferroelectric material is exceeded, and, in the volatile operating mode, the electric coercive field strength of the ferroelectric material is no exceeded, or the operating voltage across the information storage element in the nonvolatile operating mode results in a saturated polarization hysteresis, and in the volatile operating mode only in an unsaturated polarization hysteresis.

It is the finding of the present invention that the aim of nonvolatile storage with long memory endurance can be obtained together with the advantages of easy manufacturability when a memory cell is used having an information storage element comprising a ferroelectric material, and the memory cell is operated in a volatile operating mode and a nonvolatile operating mode. The option of operating the memory cell in the volatile operating mode enables the associated advantages of high memory speed at long endurance, wherein, however, the option of operating the memory cell in the nonvolatile operating mode can bridge gaps in the power supply. Since such bridgings occur considerably less frequent than memory events, such a memory cell reaches, all in all, the aim of effective nonvolatile storage of data with simultaneous high operating speed and endurance.

According to one embodiment, the information storage element is a capacitor, wherein the ferroelectric material forms a dielectric of the capacitor. In again another embodiment, the information storage element is formed by a transistor, wherein the ferroelectric material is arranged in a region between gate electrode and FET channel of the transistor. In the nonvolatile operating mode, for example, a voltage increased with respect to the volatile operating mode is used across the information storage element for writing data in or out of the memory cell, such that the voltage across the information storage element in the nonvolatile operating mode results in a saturated polarization hysteresis and in the volatile operating mode only in an unsaturated polarization hysteresis, and/or such that in the nonvolatile operating mode an electric coercive field strength in the ferroelectric material is exceeded, and in the volatile operating mode the electric coercive field strength of the ferroelectric material is not exceeded.

According to an embodiment, in response to sensing a trigger event, switching from the volatile operating mode to the nonvolatile operating mode is performed in order to store a volatile state of the memory cell in a nonvolatile manner. The trigger event can be the breakdown of a power supply, in which case, for example, a power capacitor provides sufficient energy for nonvolatile storage of the state stored in a volatile manner. The trigger event can, however, also be a planned or a signalized switch off signal, in that case the desired switch off is delayed until the nonvolatile storage of the state stored in a volatile manner has been performed. Sporadic temporary, e.g. prophylactic, switching to the nonvolatile operating mode for storing with respect to threatening or apparent power breakdowns would also be possible.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
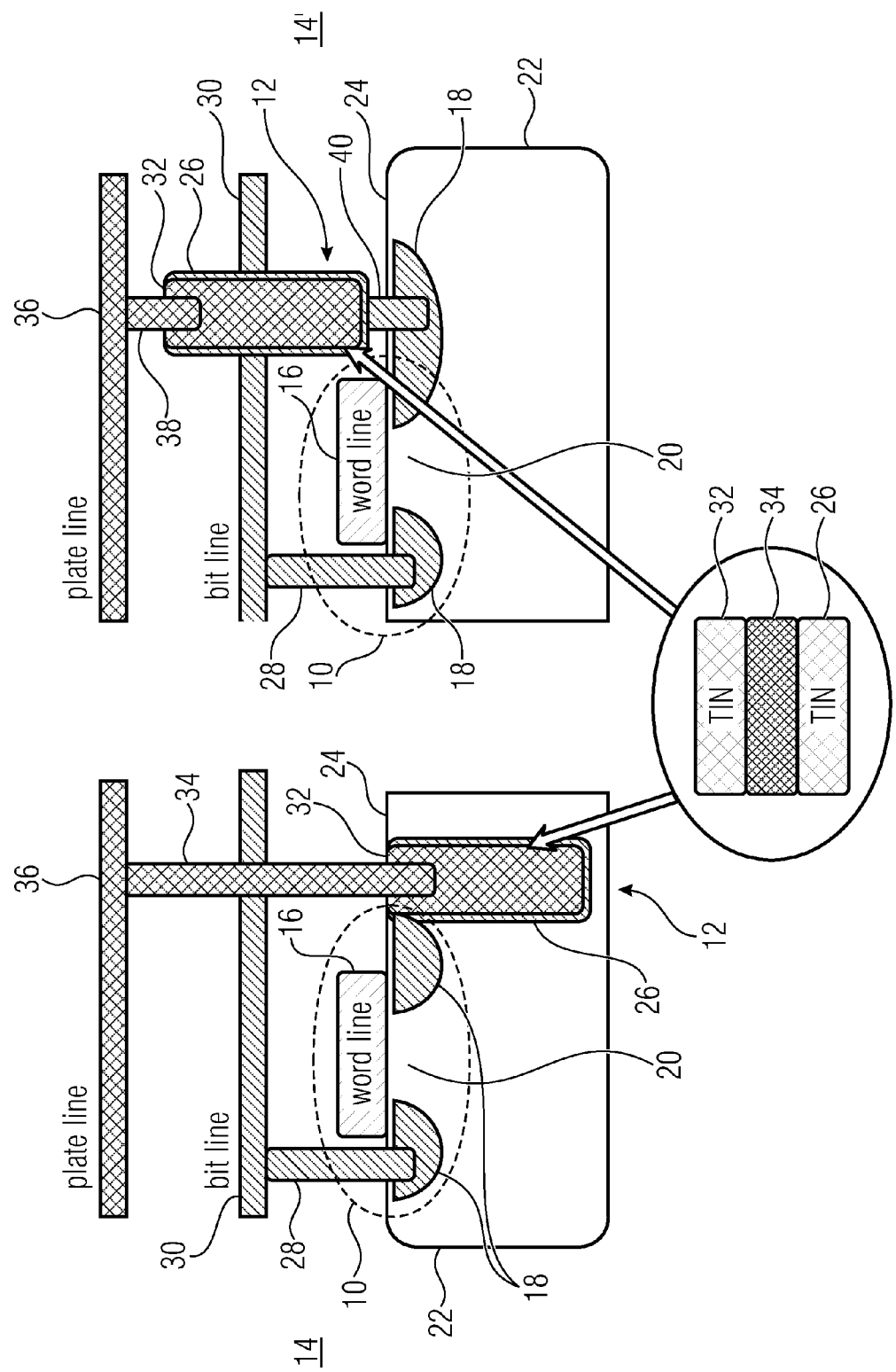
FIG. 1 is a schematic side view of two implementation options (left and right) of a memory cell according to an embodiment of the present invention having one transistor and one capacitor per cell.

Before embodiments of the present invention will be discussed below with reference to the figures, the idea leading to these subsequently described embodiments will be discussed exemplarily based on known memory technologies and skills, wherein these statements are not to be seen in a limiting sense with respect to the embodiments that will be described subsequently.

As the following discussion will show, the option of provoking ferroelectricity in some materials provides a possible, advantageously simple, starting point for providing a memory, such as a DRAM/FeRAM with a volatile and nonvolatile operating mode as well as without the necessity of adding NVM elements that are specifically intended for nonvolatile storage. Examples for materials that can be provided with the characteristic of ferroelectricity comprise hafnium and/or zirconium oxide ($HfO_2$/$ZrO_2$) based systems. It is an advantage that these two exemplary materials, i.e. hafnium and/or zirconium oxide, are already extensively used, with respect to their paraelectric state, in conventional memory technologies, such as DRAM, as described, for example, in U.S. Pat. No. 8,304,832. Thus, ferroelectric materials are indeed compatible with production technologies allowing high quantities at low costs. In all of the following embodiments, however, the ferroelectric material is not limited to $HfO_2$/$ZrO_2$ based material systems, but any ferroelectric material can be used in these embodiments. Ferroelectric materials, such as crystals, experience, when applying a voltage across the same which exceeds the electric coercive field strength of this material, a remanent dielectric shift or polarization, and this effect paired with the fact that the material can also be used paraelectrically below this electric coercive field strength, is used according to the following embodiments for providing a fast enduring memory having a nonvolatile memory option and being easy to manufacture.

The inventors of the present invention could already build on the following basic components.

A) Volatile 1T/1C-DRAM cells can be realized for different technologies by using highly manufacturable and 3D-scalable $HfO_2$ or $ZrO_2$ based MIM capacitors. Disadvantages of these memory concepts are the volatility of the storage and the dependence on the presence of the power supply.

B) On the other hand, nonvolatile 1T/1C-FeRAM having long endurance using complex perovskite MFM capacitors are already possible. While such memory technologies are very CMOS friendly, these technologies cannot be scaled beyond a planar geometry. Additionally, the same are rather complex in terms of integration.

C) Additionally, the inventors found out that ferroelectricity in $HfO_2$ in principle enables high scalability of future FeRAM. However, nonvolatile FeRAM without any further measures would have limited endurance, since MFM endurance based on ferroelectric $HfO_2$ would be limited to approximately 1 to 10 million cycles, lacking far behind conventional FeRAM.

However, combining the strengths of A, B and C eliminates their individual disadvantages: the result is, exemplarily, 1T/1C FeRAM memory that is highly 3D-scalable based on ferroelectric $HfO_2$ and can be manufactured by using the well-established 1T/1C DRAM or eDRAM concept, wherein the memory comprises two operating modes, namely a first volatile mode, used, for example, when the memory is supplied with power, and wherein lower voltages are used, such as in a normal volatile DRAM, wherein here at these low voltages the ferroelectric material, such as ferroelectric $HfO_2$ acts like a normal memory node dielectric with high endurance, and a second nonvolatile mode activated, for example, when the power supply is switched off, and wherein the current memory state is permanently stored by applying a high voltage pulse to the ferroelectric material which switches the ferroelectric polarization. Since or if the nonvolatile mode is only used when necessitated, endurance requirements with respect to the high electric fields are lowered significantly.

Concerning specific materials and memory cell technologies, the above statements are to be considered merely exemplarily. The following statements will show that memory cells according to the present invention can be implemented differently, that the ferroelectric material cannot only be used as dielectric in a storage capacitor of a 1T/1C memory cell, but also as a bias field generator between gate electrode and FET channel of a 1T memory cell, and that different control options can be used as necessitated.

FIG. 1 shows, on the left and right, exemplarily based on schematic sectional views, two different options for realizing a memory cell according to an embodiment of the present invention, according to which the memory cell is a 1T/1C memory cell, i.e. a memory cell having a transistor 10 and a capacitor 12 as information storage element. The implementation examples illustrated on the left and right of FIG. 1 differ with respect to the implementation of the capacitor 12 as a trench capacitor as shown on the left of FIG. 1, or a stack capacitor as shown on the right of FIG. 1. For differentiating the two memory cell types of FIG. 1, the memory cell on the left is indicated by reference number 14, and the memory cell on the right by reference number 14'.

FIG. 1 shows schematically that the transistor 10 is a word line transistor switched on and off via a word line 16, and can be formed, for example, as FET transistor with source and drain regions 18 and an intermediate channel region 20 in a substrate 22 and a gate electrode (not shown specifically) controlled by the word line 16. The word line 16 can form, for example, the gate electrode of the transistor 10 at the same time. Word line 16 and/or gate electrode can be formed of metal or polycrystalline semiconductor. The gate electrode is separated, for example by an insulating layer, from a substrate top side 24 on which drain and source regions 18 abut, in order to oppose the channel region 20.

According to the implementation version illustrated on the left of FIG. 1, the capacitor 12 is, for example, a trench capacitor, i.e. a capacitor formed in a trench in the substrate 22, and whose one electrode 26 lining the trench wall is connected to a bit line 30 via the transistor 10 and a via 28, and whose inner electrode 22 in the inside of the trench, separated from the electrode 26 via the capacitor dielectric 34 is connected to a plate line 36 via a via 34. The trench can be formed in the material of the substrate 22, such as silicon, or in an oxide layer, such as the field oxide of the substrate in MoL or BEoL. The bit line 30 and the plate line 36 are, for example, routed in different wiring levels above the substrate 22, as illustrated in FIG. 1, but other wiring options are also possible.

As was mentioned above and will be discussed in more detail below, ferroelectric material is used for the dielectric 34, such as ferroelectric $HfO_2$ or ferroelectric $ZrO_2$. Details on how the bit line, word line and plate line can be routed when the memory cell 14 is part of a memory cell field will also be discussed in more detail below.

The implementation variation of FIG. 1 as illustrated on the right differs from the one illustrated on the left merely by the plane in which the capacitor 12 is formed; in the case of FIG. 1 on the left, the capacitor 12 is formed above the substrate 22 or above the processing top side 24, for example in a stacked manner, wherein the electrode 32 is electrically connected via, for example, a via 38, to the plate line 36, and the other electrode 26 is electrically connected to the bit line 30 via a via 40 leading in the opposite direction across the transistor 10.

Before the two operating modes in which the memory cell 14 is operable, will be discussed, variation possibilities will be discussed below.

Both implementation variations of FIG. 1, i.e. the option with trench capacitor as well as the option with stack capacitor are facilitated when $HfO_2$ or $ZrO_2$ with ferroelectric characteristic is used as capacitor dielectric 34, namely due to its excellent ALD ability and the high step coverage of these materials. In this way, based on the memory cell 14 according to both implementation variations, it is possible to realize an NV-DRAM by using conventional DRAM or embedded DRAM cell architectures. All in all, high scalability results. The fact that similar to FeRAM cell architectures, a plate line 36 exists to bias the capacitor 10 in a bipolar manner in order to switch the ferroelectric dipoles into the nonvolatile operating mode, will be discussed in more detail below.

As indicated in FIG. 1, electrodes 32 and 26 of the capacitor or MFM capacitor 10 can be formed by using TiN electrodes, wherein, however, other materials are also possible, and these TiN electrodes can be used, for example, with ferroelectric $HfO_2$ as dielectric 34 in combination, wherein, however, there are also alternatives for the ferroelectric materials, such as $ZrO_2$. The electrodes are deposited, for example by using a low temperature process. In this case, they are called "cold electrodes".

The ferroelectricity in the ferroelectric material 34, such as $HfO_2$, is, for example, obtained by the solid-state solution of $HfO_2$—$ZrO_2$, or, for example, by dopants in the material, such as $HfO_2$ or $ZrO_2$, wherein the dopants can, for example, be Si, Al, Ge, Sr, Y, La, Gd, Er, Sc or other bi-, tri- or tetravalent dopants, wherein the dopant concentration can, for example, be selected to be <10 mol. %.

The layer thickness of the ferroelectric 34 can, for example, be selected between 4 and 20 nm, depending on the desired operating voltage for the nonvolatile mode. The MFM capacitor 10 can be manufactured by using PVD, CVD or ALD depositing technologies. For 3D capacitors, for example, ALD is used.

Before the two operating modes of the memory cell of FIG. 1 according to an embodiment will be discussed in more detail, an option how the memory cell 14 can be joined, for example by a multiplication, to a memory array 42 of a memory 44, such as in a regular array of rows and columns, will be described with reference to FIG. 2.

Figure 2:
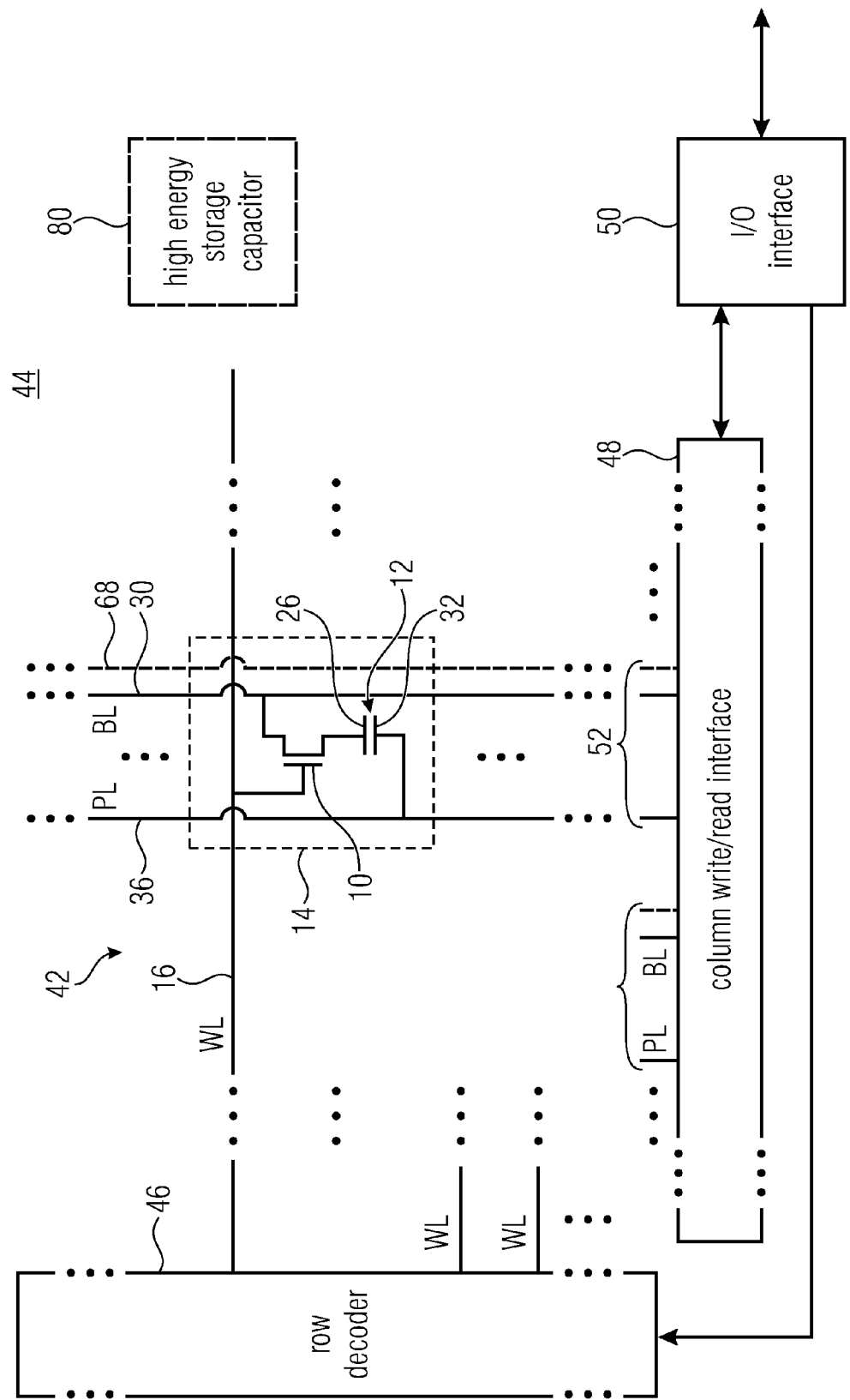
FIG. 2 is a schematic block diagram of a memory structured with cells according to FIG. 1 according to an embodiment.

For clarity reasons, FIG. 2 shows merely one cell 14 of the field 42 among the otherwise not shown memory cells arranged in columns and rows. As shown, each word line 16 runs, for example, in row direction, and each plate line and each bit line 30 in column direction, such that each word line 16 is coupled with memory cells 14 or the transistor 10 of the same in a respective row of the field 42, and each plate line 36 and each bit line 30 with memory cells 14 that are arranged in a respective column of the array 42.

Apart from the cell array 42, the memory 42 includes a row decoder 46, a column read/write interface 48 and an input/output interface 50. The input/output interface 50 receives read instructions with a respective read address and write instructions with a respective write address and data to be written from outside. In a manner described below, the input/output interface 50 controls the row decoder 46 in dependence on the read/write address so that the same controls the correct word line according to the received address. For each combination 52 of bit line 30 and plate line 36, the column read/write interface 48 is able, in a manner that will be described below, to perform a write or read operation with respect to the memory cell 14 that has been selected among the memory cells 14 coupled to this combination 52 of the field 42 by the word line 16 activated by the row decoder 46. For this, the interface 48 receives, in the case of a write operation, the data to be written from the input/output interface 50, and in the case of a read operation, the column read/write interface outputs the read data of the different line combinations 52 running in column direction to the interface 50 for outputting towards the outside.

After possible structural implementations of a memory cell and a memory with an array of such memory cells have been described with reference to FIGS. 1 and 2, the mode of operation will be discussed in more detail below, by sketching how a write operation and/or a read operation is performed with respect to the memory cell 14. Here, it will be seen that the nonvolatile operating mode can be realized according to an FRAM architecture, and the volatile operating mode can be implemented in a DRAM conform manner. In this regard, it should be noted that a possible implementation of the embodiment of FIG. 2 provides that the memory array 42 is realized in the form of a FRAM periphery provided with the additional ability of carrying out the volatile operating mode as described below which can use, as has been stated, a DRAM operating protocol.

First, the volatile operating mode is described as first operating mode. As stated, this operating mode can be implemented in a DRAM protocol conform manner, but this is not necessarily the case. This mode can be the only one that can be used from the outside by respective instructions to addressed cells. The nonvolatile mode can be implemented as a mode which is used only "in emergency" or in operating voltage problems, in order to restore the data stored in the cell field or to save them by nonvolatile storage, and to restore them when the operating voltage is present again. However, alternative embodiments are also possible.

Figure 3:
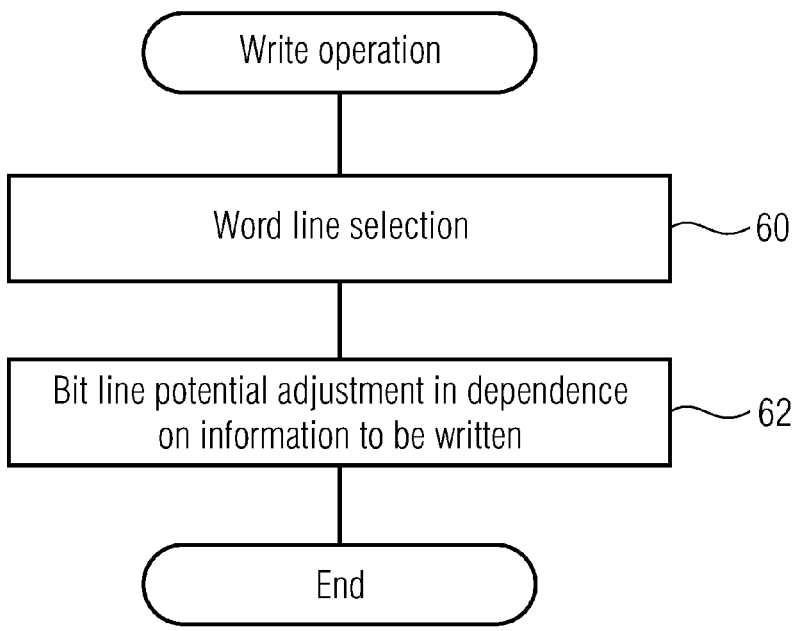
FIG. 3 is a flow diagram of a write operation in the volatile operating mode in the cell of a FIG. 1.

First, the write operation will be described based on FIG. 3. In a step 60, one of the word lines of the cell field 42 is selected, such as the word line 16 of FIG. 1 or 2. As has been described with reference to FIG. 2, several memory cells 14, for example, are connected to the word line 16, i.e. memory cells that belong to different bit line/plate line combinations 52. The "selection" 60 has the effect that the word line transistor 10 is switched on, whereby a voltage can be applied to the capacitor 26 via the pair of bit line 30 and plate line 36. According to an embodiment, in the nonvolatile operating mode the plate line 36 is, for example, permanently connected to ground, for the whole field 42.

Depending on the information to be written, such as the bit to be written, bit line potential adjustment is carried out in step 62, i.e. the bit line 30 is charged, for example, to a high level or a low level in order to write "1" or "0" or 1 or 0 memory state into the capacitor 12. In other words, in step 62, with activated word line 16 and hence conductive transistor 10, the information to be written is written into the capacitor 12 to subsequently define the state of the memory cell 14 which corresponds to the state of charge of the capacitor 12. The information to be written does not necessarily have to be binary or a bit, and accordingly the state of charge can also be non-binary. A more than two-valued piece of information can also be written into the memory cell 14 in step 62 by suitably adjusting the voltage across the capacitor 12. This "write voltage" results in an electric field within the ferroelectric material, whose strength is below the coercive field Ec, or more accurately the electric coercive field of the ferroelectric material of the capacitor 12, such that the ferroelectric material is operated like a linear dielectric. The write or operating voltage is, for example at $V=\frac{1}{2}Ec*dFE$, wherein dFE is the thickness of the ferroelectric material between the electrodes 26 and 32 of the capacitor 12, or is, for example, in a range of +/−20% around the same.

Figure 4:
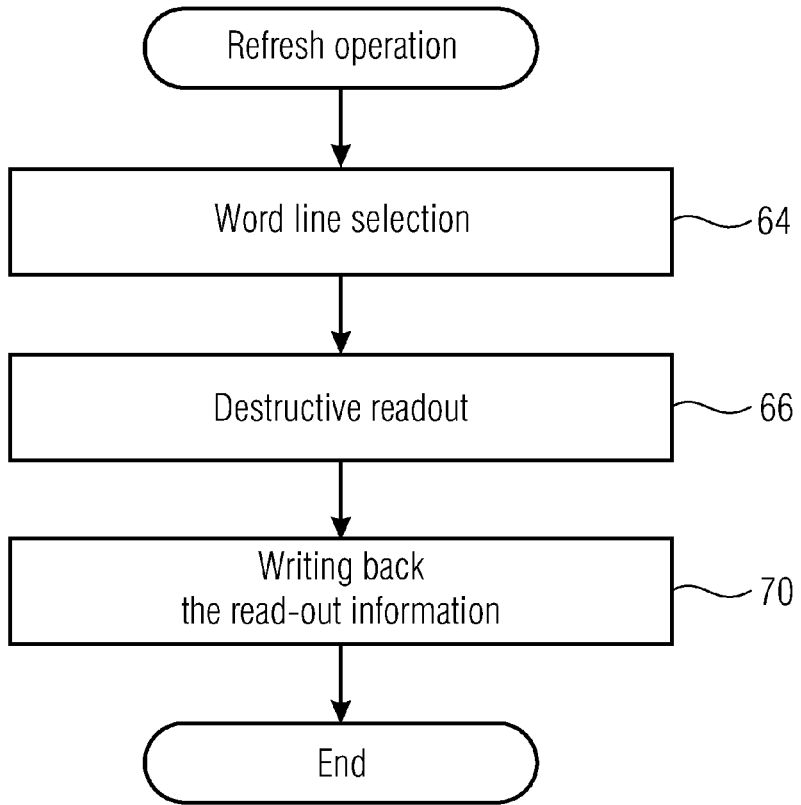
FIG. 4 is a flow diagram of a refresh operation in the volatile operating mode in the cell of FIG. 1 according to an embodiment.

In the volatile operating mode, which will be described first, refresh operations take place intermittently, such as periodically or depending on memory state measurements, where the memory states of the memory cells 14 are refreshed, since the memory state is volatile, such as by charge diffusion. One example for a refresh operation is shown in FIG. 4. First, again, a word line is selected 64. In a cell field 42, the individual memory cells 14 are refreshed, for example, word line by word line, wherein the order between the word lines can be sequential from one to the next adjacent row or according to another pattern or depending on above-mentioned memory state measurements. After step 64, with active write line 16 and hence a transistor 10 switched into a conductive state, destructive reading out 66 of the memory state of the memory cell 14 follows. For preparing step 66, for example, the bit line 30 is pre-charged, such that at the time of word line activation in step 64, depending on the state of charge of the capacitor 12, the bit line 30 is discharged or charged further. The alternative charging or discharging represents the information stored in the memory cell 14 and is sensed, for example, by a bistable sense amplifier, which, for example, compares the potential given by charging or discharging on the bit line 30 to the potential of an optionally existing second bit line 68 running in parallel to the bit line 30, illustrated in a dotted manner in FIG. 2, and shifts into one of the two stable states. However, other read out options are also possible. Subsequently, the memory state of cell 14 read out in that manner, such as the read out bit, is written back in a step 70, wherein step 62 of FIG. 3 can be performed accordingly, when the word line has remained active between steps 66 and 70.

Figure 5:
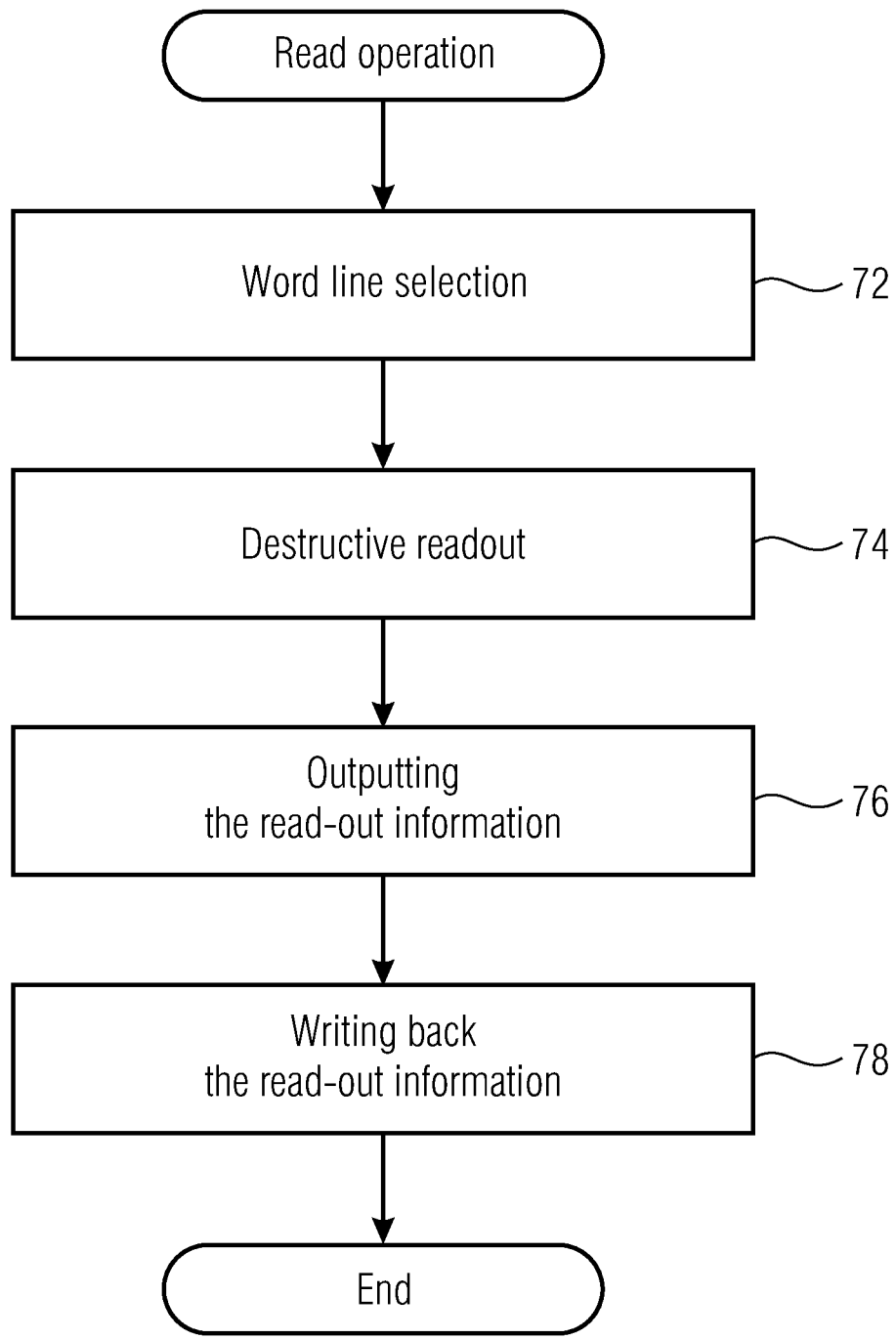
FIG. 5 is a flow diagram of a read operation in the volatile operating mode in the cell of FIG. 1.

A read operation in the volatile operating mode is illustrated in FIG. 5. A read operation in the volatile operating mode corresponds, essentially, to the refresh operation in the volatile operating mode as described with reference to FIG. 4. Word line selection 72 depending on a read address is preformed analogously to step 60, whereupon destructive reading out 74 is performed according to step 66. The difference is that the read out state, such as the state of charge "1" or the state of non-charge "0", i.e. the capacitor 12 is charged or not, is output in step 76, such as by the interface 48 via the interface 50 towards the outside. As already described above, destructive reading out 66 or 74 can be performed via a sense amplifier or read amplifier connected to the bit line 30. Subsequently, in step 78, the read out information is then also written back, according to the proceedings in step 70 during the refresh operation. Similar to the remarks in FIGS. 3 and 4, it should be noted that the process of reading with activated word line 16 is performed simultaneously, for example, for a plurality of memory cells 14, which are connected to the word line 16, wherein the interface 48 comprises, for example, a respective sense amplifier for each line combination 52, the read-out memory states of all of these memory cells belonging to one row form a read-out word, as well as in the case of writing the memory states written into the memory cells form a data word.

During a voltage supply or power supply situation, i.e. in particular during a volatile operating mode in which the memory 44 of FIG. 2 is an optional high energy storage capacitor 80 may be charged and maintained in the charged state, by connecting this capacitor 80, for example, in parallel to a power supply of the memory 44 in order to be constantly charged by the operating voltage to subsequently, when the operating voltage breaks down, have sufficient energy to transfer the memory state of all memory cells 14, starting from an unpredictable supply voltage breakdown, from the volatile memory state to the nonvolatile memory state. For this, a read operation is performed on the volatile operating mode according to FIG. 4, followed by a write operation in the nonvolatile operating mode as described below, supplied by the energy maintained in within the capacitor 80 and in that write operation the volatile state of the cells is written back into the same in a nonvolatile manner.

Figure 6:
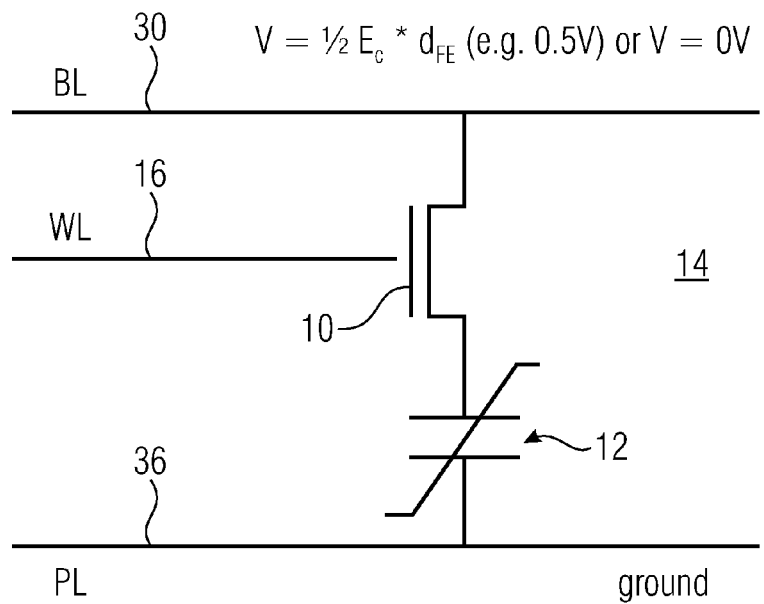
FIG. 6 is a circuit diagram of the cell of FIG. 1 stating examples of potentials applied during writing in the volatile mode.

Summarizing the volatile operating mode, FIG. 6 shows with what potentials plate line 36 and bit line 30 are provided during a write operation, depending on the information to be written in the volatile operating mode. In the exemplary case, the plate line 36 is continuously connected to ground, and the bit line 30 is adjusted to 0 Volt or $\frac{1}{2}E_c*d_{FE}$ depending on the bit or the information to be written. The resulting electric field in the ferroelectric material of the capacitor 12 is low, such that the ferroelectric material behaves like a linear dielectric.

In the following, the second operating mode will be described, namely the nonvolatile operating mode, which can be implemented, for example, similar to an FRAM operation.

Figure 7:
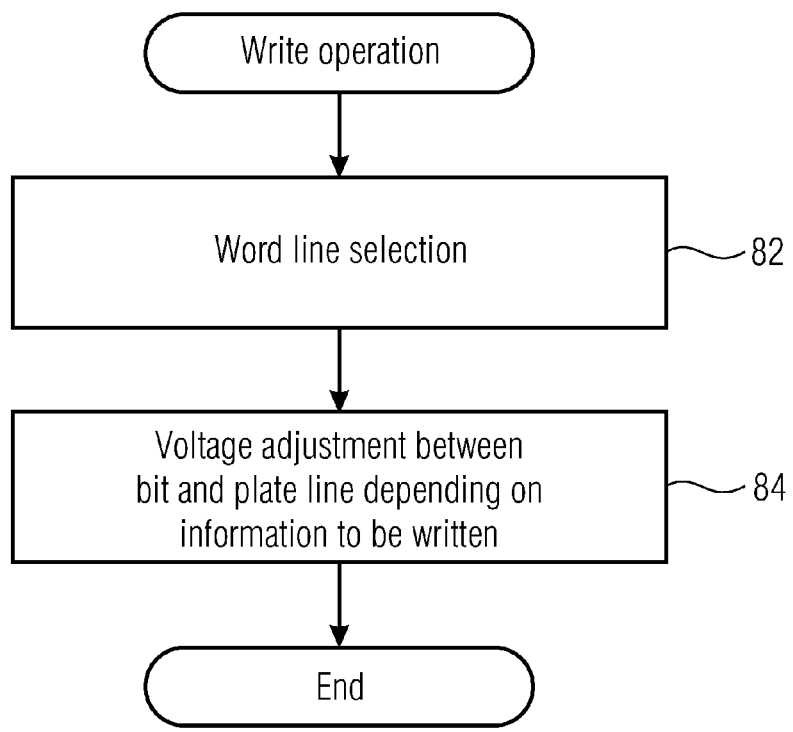
FIG. 7 is a flow diagram of a write operation in the nonvolatile mode in the cell of FIG. 1.

The write operation in the nonvolatile operating mode is illustrated in FIG. 7. A word line selection 82 according to step 60 in FIG. 3 is performed. With activated word line 16 or accordingly the transistor 10 switched into a conductive state, in step 84, voltage is applied between bit line 30 and plate line 36 and adjusted, such that a polarization state corresponding to the information to be written results in the capacitor 12 or the ferroelectric material within the same. Advantageously, the voltage adjustment in step 84 switches between opposite polarization directions in dependence on the information to be written. For example, depending on the information to be written or the bit to be written, the polarization state of the capacitor 12 is adjusted, by connecting the bit line 30 to ground, while the plate line is connected to write voltage or, in the opposite case, the plate line is connected to ground while the bit line is connected to write voltage. However, the write voltage is higher than the write voltage in step 62, namely so high that the electric field applied across the ferroelectric material in the capacitor 12 exceeds the electric coercive field strength of the ferroelectric material. For example, the write voltage V is adjusted to $3*E_c*d_{FE}$, wherein again $d_{FE}$ is the thickness of the ferroelectric material between electrodes 26 and 32 of the capacitor 12. In the nonvolatile state, memory state written once does not have to be refreshed. Thus, refresh operations are not necessitated in the nonvolatile operating mode. Rather, the memory state is maintained even in the case that the voltage supply breaks down. As in the case of writing in the volatile operating mode, the write operation of FIG. 7 can be performed simultaneously for several memory cells, namely memory cells connected to the active word line 16, in that the interface 48 adjusts the voltage between each power combination 52 to which one of the memory cells 14 is connected, whose transistor 10 is switched into a conductive state via the activated word line 16.

Figure 8:
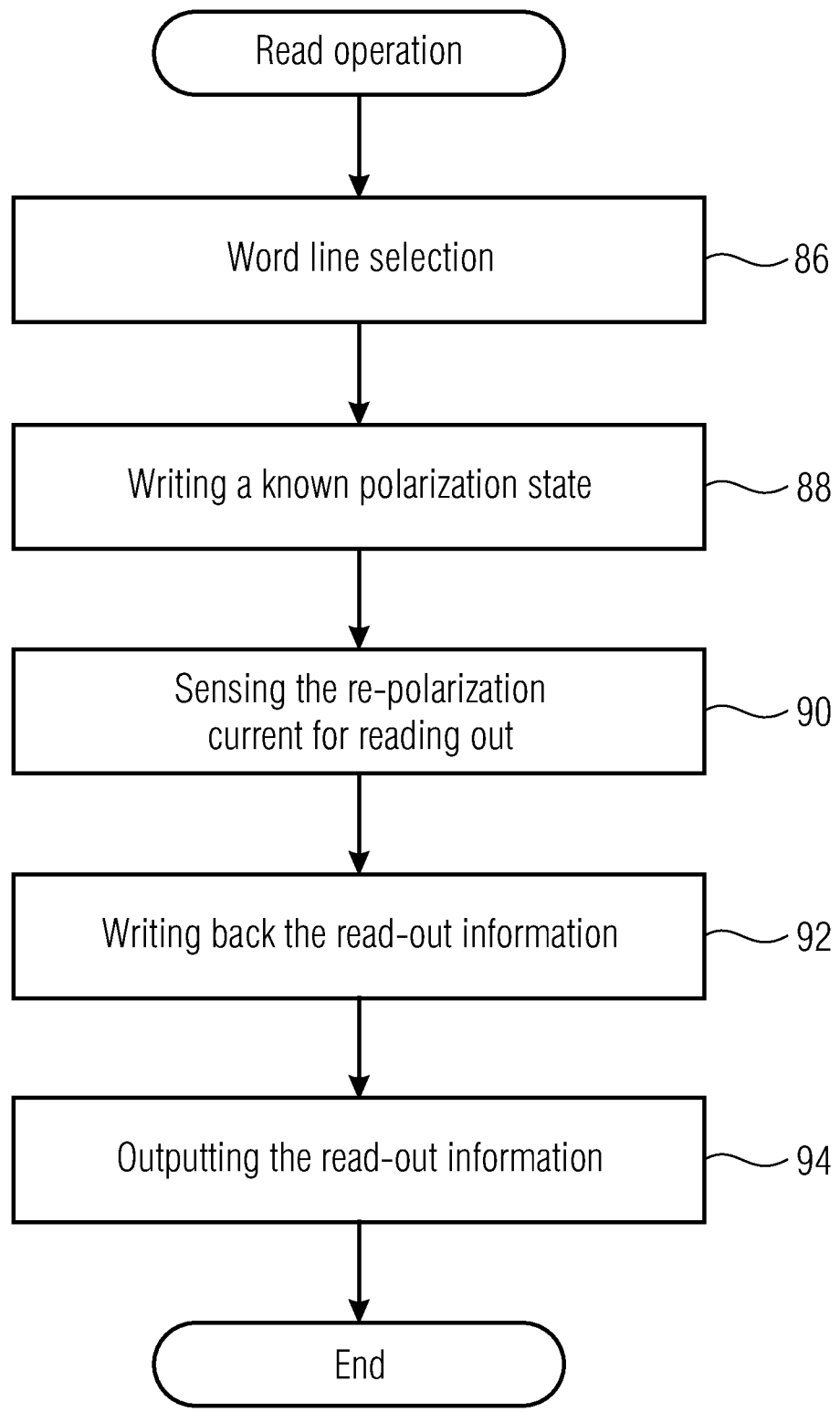
FIG. 8 is a flow diagram of a read operation in the cell of FIG. 1 in the nonvolatile mode.

FIG. 8 shows a read operation in nonvolatile operating mode, i.e. reading out a state stored in a nonvolatile manner. As described in FIG. 7, the memory state stored in a nonvolatile manner is the polarization of the ferroelectric material of the capacitor 12. For reading out the same, again, word line selection 86 is performed according to step 72 of FIG. 5. With activated word line 16 or a transistor 10 switched into a conductive state, writing of a known polarization state follows in step 88. The plate line 36 is connected, for example, to the above mentioned operating voltage, while the bit line 30 is connected to ground. This destroys the memory state or polarization state. However, it can be sensed in a step 90 what repolarization current flows to or from the capacitor 12. It is, for example, possible that the plate line 36 is connected to the write potential in step 88, and a sense amplifier senses the current for repolarization at the bit line, which is 0, when the memory state was different than the state written in step 88, i.e. the memory cell had been polarized oppositely, and unequal 0 when a repolarization has actually taken place. Basically, the same sense amplifier circuit as in the volatile operating mode could be used for reading. Put simply, for example, in step 88, the polarization state "1" is written into the memory cell, and in step 90 it is sensed whether the repolarization current is greater or less than a specific threshold. If the cell 14 has already been in the state "1", a lower current is sensed, and if the cell 14 only jumps from "0" to "1", a higher current than the threshold is sensed. In step 92, the information read out in that way, which corresponds to the sensed polarization state, is written back again into the cell and the read-out information is output (step 94).

Figure 9:
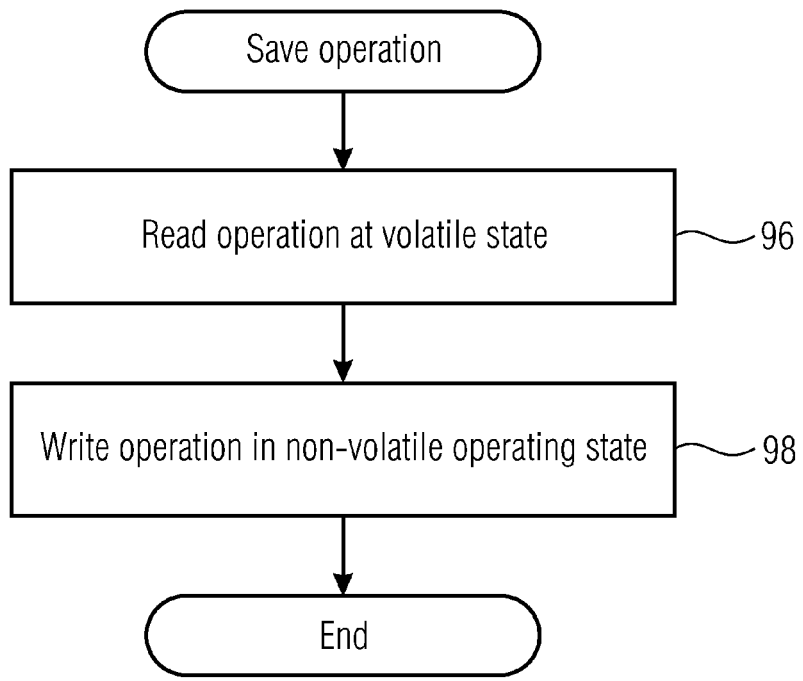
FIG. 9 is a flow diagram of a save operation when switching from the volatile into the nonvolatile operating mode in the cell of FIG. 1.

It is possible that the memory 44, in contrast to the above description, is not able to perform induced write/read operations according to FIGS. 7 and 8 from the outside via the interface 50. Alternatively or additionally, the memory 44 of FIG. 2 might perform the nonvolatile operating mode merely for "data recovery", triggered by events, for example sensing a breakdown of a power supply of the memory 44, etc. FIG. 9 shows, for example, a save operation that can be triggered, for example, by such sensing of the breakdown of a voltage supply of memory 44, or is performed periodically or intermittently in an automatic manner, or in the case of sensing a switch off signal obtained from the outside, which indicates a planned power supply termination. Merely in the first case corresponding to an unpredictable power supply termination, the energy for performing the save operation at the memory cells 14 originates from the capacitor 80. Otherwise, the energy for this can still be taken from the normal voltage supply of the memory 44.

Figure 10:
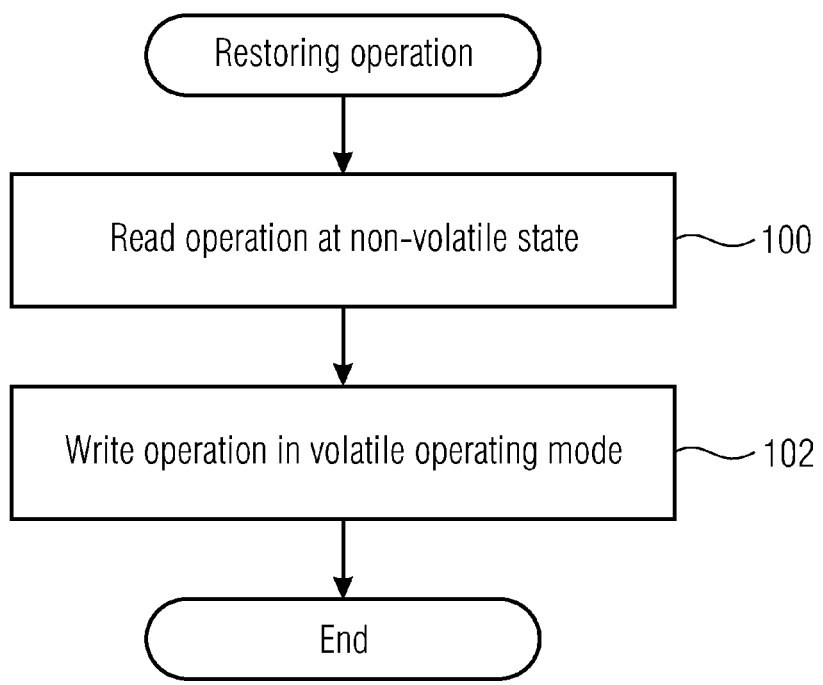
FIG. 10 is a flow diagram of a restore operation in the transition from a nonvolatile to a volatile operating mode in the cell of FIG. 1.

The save operation of FIG. 9 consists of connecting in series a read operation in the volatile memory state 96 followed by a write operation 98 in the nonvolatile operating mode per memory cell 14. For example, for saving the memory states of all memory cells 14, the row decoder 46 serially activates all word lines in order to perform steps 96 and 98 per activated word line in parallel and between the word lines in series. The read operation 96 corresponds to steps 72 and 74. However, the read-out volatile state is not written back again in a volatile manner, but in step 98, the write operation is performed according to step 84, such that the volatile state read out in step 96 is written back in a nonvolatile manner, and also the output 76 of read-out information to the outside is merely optional. FIG. 10 shows a recovery operation matching the save operation. The same is triggered, for example, by a trigger event which can, for example, be power up of the memory 44 or the start of the supply voltage of the memory 44. The restore operation consists also of a series of two steps, namely a read operation 100 at the nonvolatile state of a memory cell followed by a write operation in the volatile operating mode at this memory cell, wherein as described above with respect to FIG. 9, steps 100 and 102 are performed in parallel at memory cells connected to a currently activated word line, and for restoring the memory states of all memory cells 14 of the memory 44, e.g. all word lines 16 are activated, for example serially, to perform the restore operation at the respective memory cells 14. The read operation 100 is performed according to steps 86 to 90, whereupon the memory state is sensed, which corresponds to the polarization state is written back in step 102 according to step 62.

If no deactivation of the word line takes place between steps 96 and 98, step 82 prior to step 84 can be omitted within the write operation 98, and in the same way, step 60 prior to step 62 in the write operation 102 can be omitted when the word line is not deactivated in the meantime.

After a restore operation according to FIG. 10, the memory 44 can remain in a volatile operating mode.

The above embodiments for memory cells are easy to manufacture. For producing or manufacturing the same, $HfO_2/ZrO_2$-based 3D-trench or stack-DRAM or embedded DRAM cells can be used, which are manufacturable in mass production. The above embodiments have the additional advantages of adding non-volatility.

Thus, the above embodiments could be usefully incorporated anywhere where merely a little or unstable energy supply exists or is available, but the stored data have to be stored reliably. Such applications are, for example, medical technology where medical data such as a reliable data log is to be stored in sensitive mobile applications, smart grid applications where secure logging of consumption data is to take place, industrial control applications where parameter logs for process control are to be securely stored, or computer applications where transaction logs, for example for redundant storage in RAID technology are to be securely stored.

Figure 11:
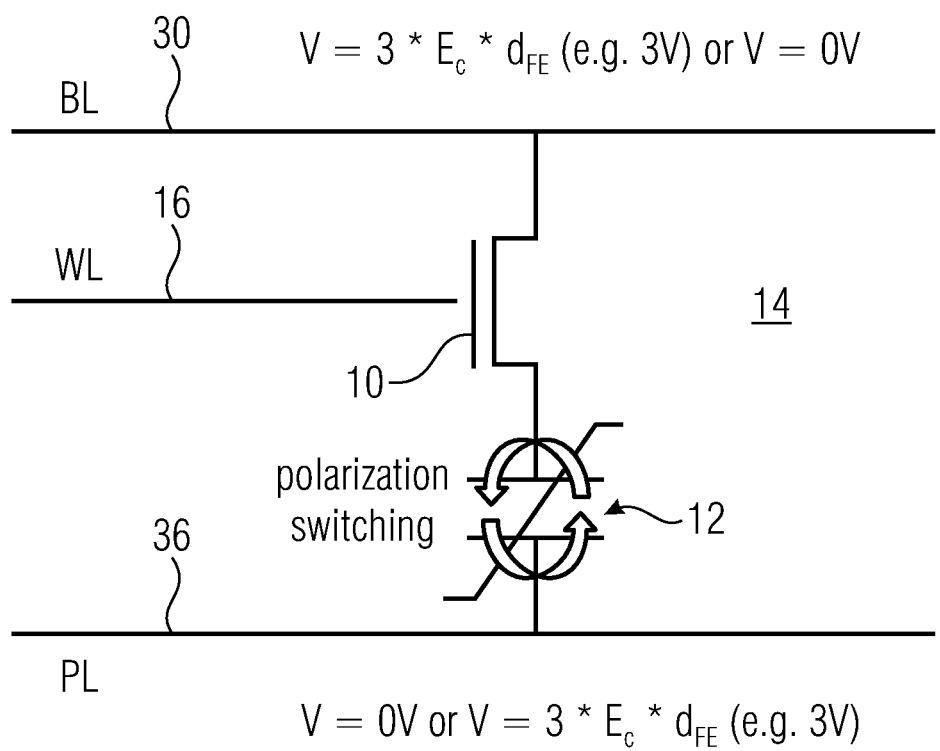
FIG. 11 is a circuit diagram of the cell of FIG. 1 with potentials during a write operation in the nonvolatile operating mode.

For the sake of completeness, FIG. 11 shows, similar to FIG. 6, potentials between which bit line and plate line are switched or controlled during writing, here for the nonvolatile operating mode. It should be noted that similar to the discussion of the volatile operating mode, the operating voltage does not necessarily have to be exactly $3*E_c*d_{FE}$ but can deviate therefrom by ±20%. Since depending on the memory state to be written for a memory cell 14, either the bit line 30 or the plate line 36 has to be connected to the high voltage or operating voltage, while the respective other of the two is connected to ground, in the cell array 42 of the memory 44, each column of cells has its own plate line 36, which can be controlled separately from the other plate lines 36.

In the above described embodiments, in the nonvolatile operating mode, a voltage over the information storage element increased with respect to the volatile operating mode has been used for writing, namely such that in the nonvolatile operating mode an electric coercive field strength of the ferroelectric material is exceeded and in the volatile operating mode the electric coercive field strength of the ferroelectric material is not exceeded. The latter criterion of non-exceeding can also be loosened. The voltage over the information storage element could alternatively also be varied in the modes, such that the same results in a saturated polarization hysteresis in the nonvolatile operating mode and only in an unsaturated or no polarization hysteresis in the volatile operating mode. In the volatile mode, for example, the write voltage is adjusted such that a field strength smaller than or equal to $1.5 \cdot E_c$ ($E_c$=coercive field strength) results in the ferroelectric material, and in the nonvolatile mode the same is adjusted such that a field strength of greater than or equal to $1.5 \cdot E_c$ ($E_c$=coercive field strength) results in the ferroelectric material, or, in the volatile mode, the write voltage is adjusted such that a field strength smaller than or equal to $1 \cdot E_c$ ($E_c$=coercive field strength) results in ferroelectric material, and, in the nonvolatile mode, the same is adjusted such that a field strength of greater than or equal to $1.5 \cdot E_c$ ($E_c$=coercive field strength) results in the ferroelectric material.

The above described embodiments related to 1C/1T memory cell structures. The following embodiments show, however, that it is also possible to form a memory cell in a 1T memory cell structure. The result is a 1T memory cell having a partly volatile operating mode and a strictly nonvolatile operating mode. The transistor of this memory or memory cell uses the ferroelectric material in a region between the field effect channel of the transistor and the gate electrode. Similar to the embodiments described above it is possible to implement the design of the 1T memory cell analogously to a 1T DRAM cell.

The considerations that led to the following embodiments are as follows. The option of adding nonvolatile components to conventional volatile memories, such as SRAM or DRAM, for preventing data loss at planned or even unplanned emergency storage losses, has already been discussed in the introductory part of the description of the present application. Here, an additional NVM element, such as an NV-DRAM, is added to a volatile memory cell. An NV-DRAM of this type is, for example, a combination of a conventional DRAM and a flash cell. However, as discussed in the introductory part of the description, this does increase system complexity and prevents scaling.

Among other candidates, the ferroelectric field effect transistor FeFET has also been considered as a possible replacement for a conventional 1T/1C DRAM; he has the advantages of a smaller cell size since an FeFET cell merely comprises one transistor, as well as non-volatility. However, despite all advantages, the endurance of such an FeFET is limited to about $10^5$ cycles and this is far too little for a true candidate for a DRAM successor. If non-volatility is abandoned, the endurance of an FeFET can be increased up to approximately $10^{12}$, which is sufficient even for DRAM expectations. Obviously, the abandonment is accompanied by the disadvantage of losing complete non-volatility.

The option of manufacturing FeFET cells also with $HfO_2$ or $ZrO_2$ as gate oxide or at least part of the gate oxide turns out to be advantageous. This and the fact that in such $HfO_2/ZrO_2$ based systems, ferroelectricity can be provoked, makes it seem possible to transfer the above embodiments also to a 1T memory cell. Here, a CMOS compatible FeFET could be obtained, which does not only have the CMOS compatibility but also high scalability.

According to the following embodiments, those considerations are prosecuted further: by providing two different operating schemes or operating modes in the same memory cell it is possible to improve endurance and non-volatility at the same time. As in the above described embodiments, it is possible to use the mode for complete non-volatility with reduced endurance, i.e. the nonvolatile operating mode only in situations where the usage of this mode is inevitable or continuing in the volatile operating mode would result in data loss and possibly only to bridging the current-less or switched off phase.

Figure 12:
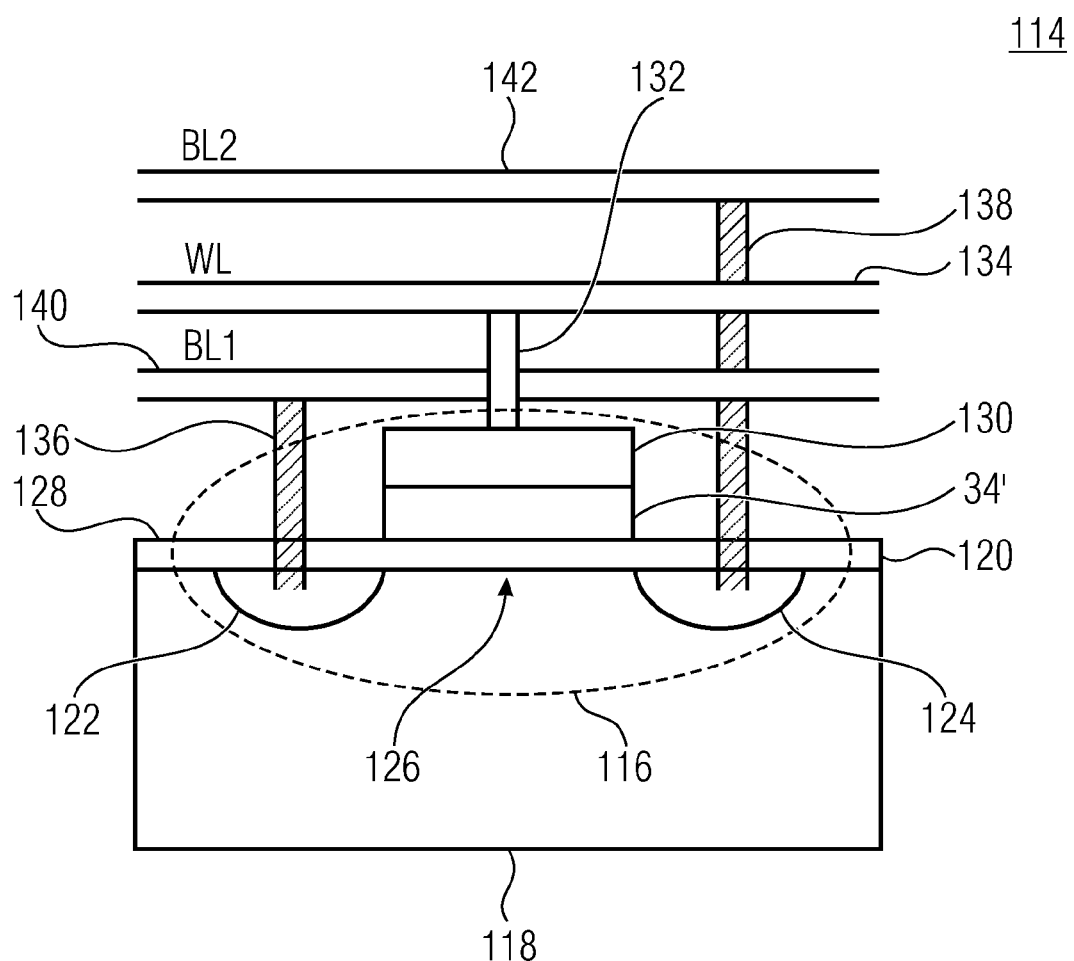
FIG. 12 is a schematic side view of a memory cell according to a further embodiment of the present application where the cell comprises only one transistor.

First, FIG. 12 shows, again similar to FIG. 1, a schematic side view of a possible implementation of a memory cell according to an embodiment wherein that memory cell is implemented as 1T memory cell. The memory cell of FIG. 12 is generally provided with reference number 114 and includes, as information storage element, a transistor 116, namely a field effect transistor which can be formed in a semiconductor substrate 118 as illustrated in FIG. 12, in which a drain region 122 and source region 124 are formed at a processing top side 120 together with an intermediate channel region 126, on the top side 120 in the substrate 118. Opposite to the channel region 126 and separated from the same by an insulating layer or a gate oxide 128 is the gate electrode 130 of the transistor 116. The gate electrode 130 is connected to a line 134 via a via 132. When the cell is integrated in a two dimensional cell field, the line 134 could be a word line, i.e. run in rows, but it should be noted that this wiring is only optional. Further, a configuration as indicated in FIG. 1 is possible, according to which the line 134 simultaneously forms the gate electrode 130. The ferroelectric material, provided with 34' in FIG. 12, merely for differentiating its use in a different memory cell, lies between gate electrode 130 and channel region 125, while all above discussed options for realizing the ferroelectric material, as discussed with respect to FIGS. 1 to 11, also apply to the ferroelectric material 34' in the present embodiment. While the ferroelectric material 34' is here also illustrated as being separated from the FET channel 126 by the insulating layer 128, it should be noted that it is possible that the ferroelectric material 34' also abuts directly on the channel 126.

Merely for the sake of completeness, but without any limitations, FIG. 12 shows the option of connecting drain and source region 122 or 124 to lines 140 and 142 via vias 136 and 138. The latter can, when the cell is integrated in a two-dimensional cell field, be bit lines, i.e. run in columns, but it should be noted that this wiring is only optional.

Thus, FIG. 12 shows that lines 140, 142 and 134 can be formed in different wiring levels above the substrate 18, but firstly, the different alternatives to this have already been discussed with respect to FIG. 1 and secondly, with respect to the line 134, for example, insofar as the same could be arranged in the shape of a metal or as polycrystalline semiconductor between the wiring levels and the substrate 118.

Figure 13:
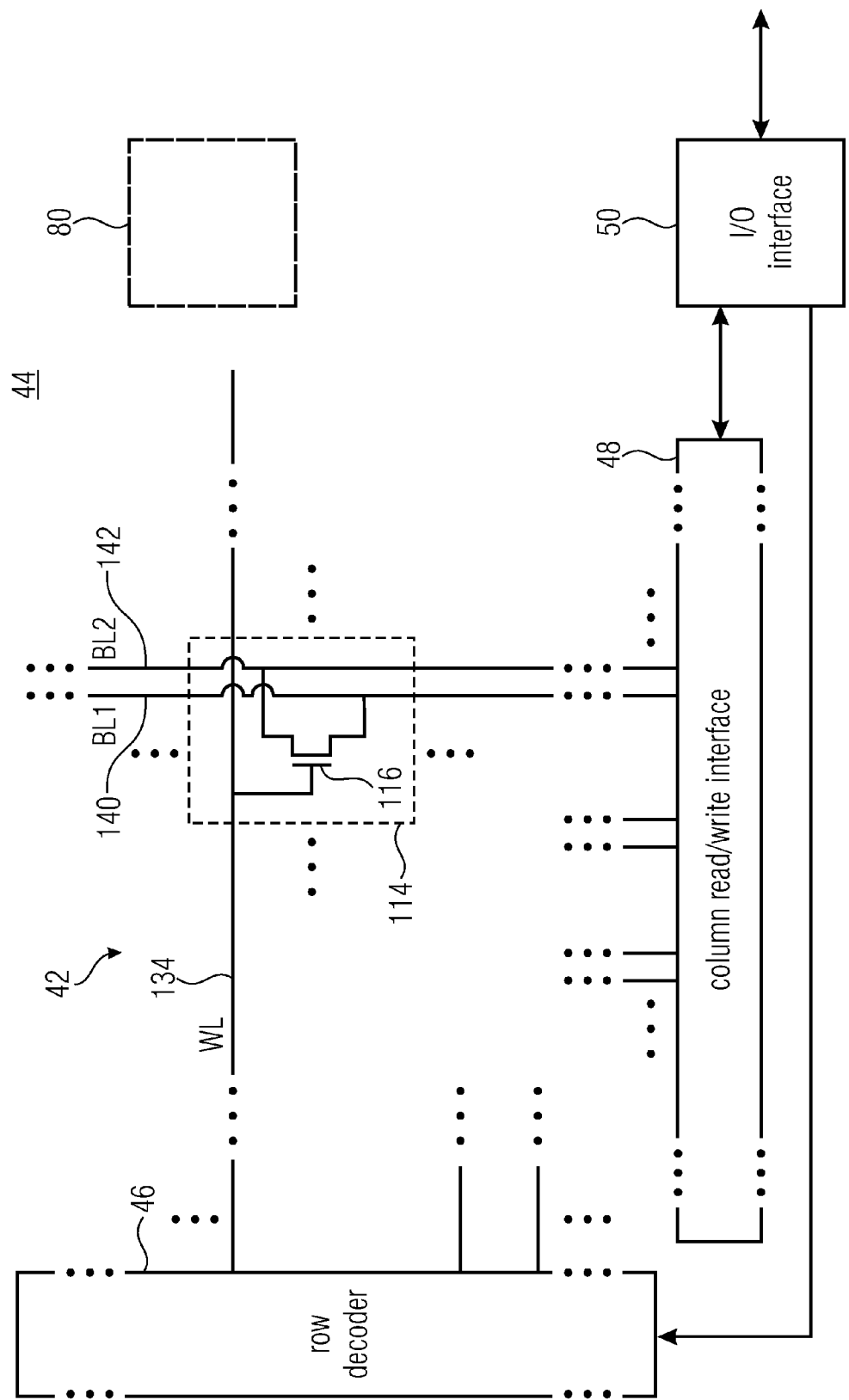
FIG. 13 is a schematic block diagram of a memory structured of cells according to FIG. 12, according to an embodiment.

Similar to FIG. 2 with reference to FIG. 1, FIG. 13 shows how memory cells 114 of the type of FIG. 12 can be arranged and connected to one another in a cell array 42 of a memory 44 in columns or rows, namely in that word lines 134 run, for example, in row direction, and hence memory cells 114 in the row of the array 42 are controllable at the gate of the transistor 116, wherein bit lines 140 and 142 run in columns and thus a pair of bit lines 140 and 142 connect several memory cells 114 to one another, which are arranged in a column of the array 42. The other elements of FIG. 13 correspond to the ones of FIG. 2 and are thus not discussed again. This means, with respect to the row decoder 46, that the same is responsible for selecting the correct word line 134, and the column read/write interface 48 is responsible for performing read/write operations with respect to those memory cells 114 which are selected, with respect to each column of the array 42, clearly and solely by the activated word line 134. Further details regarding the mode of operation of the memory 44 in the volatile operating mode and in the nonvolatile operating mode will be described below.

In the following, it will in particular be described how an operation of the memory of FIG. 13 or the memory cell of FIG. 12 can look like in the nonvolatile operating mode and the volatile operating mode. Basically, as described above with reference to FIGS. 7 and 8, it would be possible to use both operating modes as needed, but the model as mentioned with respect to FIGS. 9 and 10 will be discussed representatively below, i.e. a memory having cells according to FIG. 12 where the nonvolatile operating mode is only used in an emergency, i.e. for saving and restoring.

Figure 14:
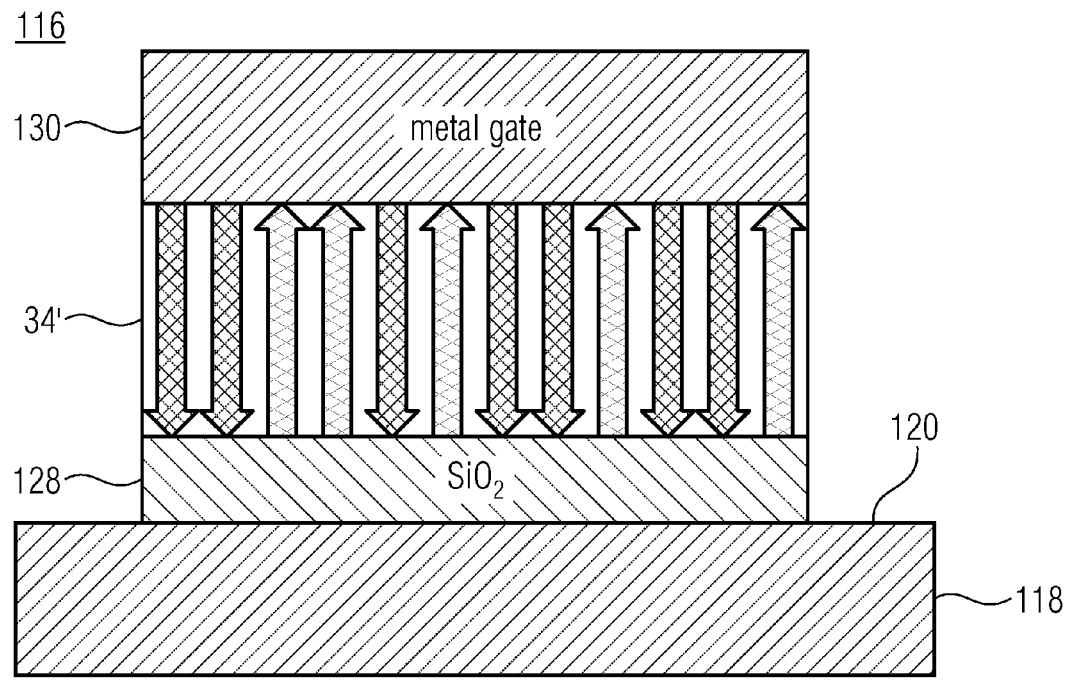
FIG. 14 is a schematic side view of the transistor of FIG. 12 with a state stored in a volatile manner.

FIG. 14 shows, at first, a section of the transistor 116 in a state where a volatile storage state is stored in the same. The gate electrode 130 is exemplarily illustrated as consisting of metal, and the gate oxide 120 exemplarily consisting of silica, but this is not limiting for either the gate electrode 130 nor regarding the insulating layer 120.

FIG. 14 shows the transistor 116 with stored information, such as a bit, wherein the stored information shows itself in an unstable orientation of inner dipoles decreasing with time, as illustrated by arrows in FIG. 14. For storing information in the transistor 116, for example, read voltage is applied between substrate 118 and gate electrode 130, such as by using word line and bit lines and if present, a possible additional line running in parallel to the bit lines and connected to a body terminal (optional) of the transistor 116. Depending on the direction of applied voltage, which again depends on the information to be stored, the material 34' has a dipole preferential direction into the one or the other direction. The word lines of the non-selected cell rows are connected, for example, to a medium potential, while the cells of the selected row are described in two cycles; first, the word line of the selected cell row is connected to a high potential and the bit lines of the rows having a first bit value to be written and to be stored to a high potential, and the other cells having a second bit value to be written and stored to a low potential in order to obtain the unstable dipole orientation, and then, the word line is connected to the low potential and the bit lines of the rows having a first bit value to be written and stored remain on the high potential in order to obtain the unstable dipole orientation in opposite direction, and the other cells with the second bit value to be written and stored remain on the low potential, so that the dipole state does not change.

Although the dipole preferential direction persists for some time, refreshing the stored information or dipole preferential direction is necessitated in the nonvolatile operating mode.

Figure 15:
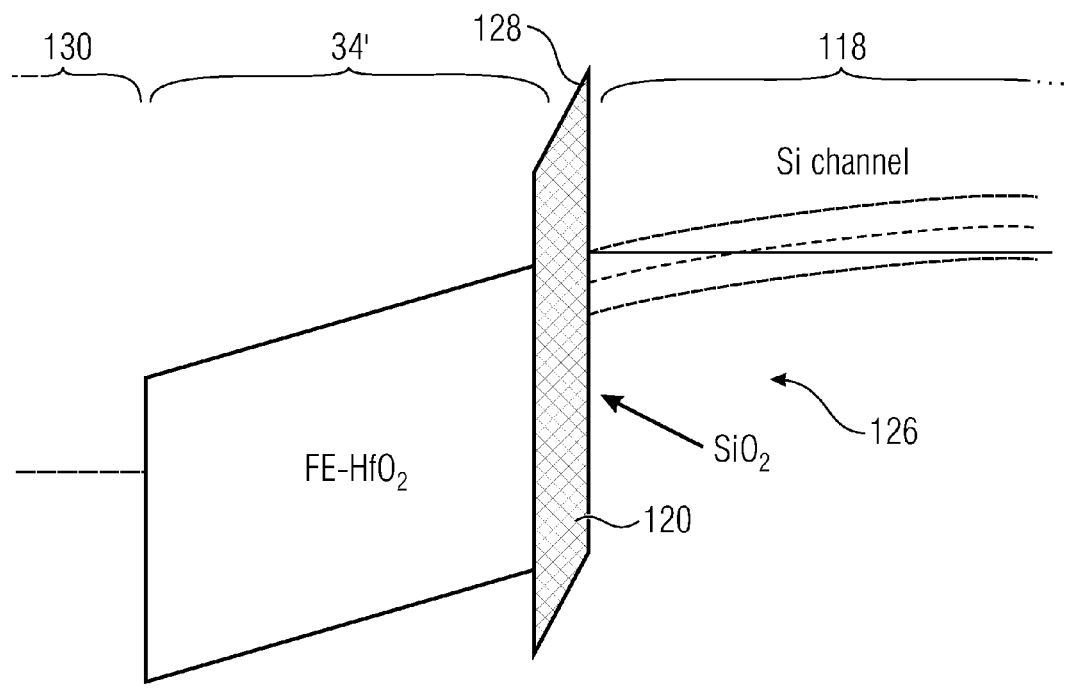
FIG. 15 is a schematic illustration of the band model between gate electrode and channel of the transistor of FIG. 14 with the state stored in a volatile manner.

FIG. 15 shows band bending during the write operation, i.e. during the applied programming or write voltage. The field in the ferroelectric and the SiO2 interface are illustrated. During volatile programming, the field in the ferroelectric and in the interface is small, just sufficient for switching in an unsaturated polarization hysteresis, during nonvolatile programming the same is large, hence also resulting in a large band bending with a charge carrier injection possibly having an additional stabilizing effect. The written dipole preferential direction in the ferroelectric material forms the stored value of the memory cell, the polarization state, which again influences the conductivity of the transistor channel. The dipole preferential direction is specifically determined in a read operation. For this, the gate electrode 130 is connected, for example, to a read voltage, and a sense circuit senses, via drain and source terminal of the transistor 116, whether 116 current above a specific current threshold flows through the transistor due to an amplification of the potential by a suitable dipole direction, or whether due to the dipole preferential direction into the opposite direction the current flowing through the transistor does not reach this threshold. The information, e.g. a bit, obtained or read out in that way can then be written back during a refresh operation. Determining the transistor channel state or polarization state of the ferroelectric material can obviously also be performed differently. Possible would be, for example, a determination of the threshold voltage. Similar to FLASH memories, for example, the $I_{on}/I_{off}$ current ratio can be sensed or the threshold voltage values can be sensed immediately to draw conclusions on the storage state.

Since both word line and bit line are used for writing in the embodiment of FIG. 13, it should only be mentioned briefly that writing might possibly take place simultaneously only for one memory cell of the array 42; only word line and bit line of that cell 116 in the field 42 are provided with the write voltage in the information-dependent voltage direction for storing a dipole preferential direction, i.e. with a high or low potential, and all other word lines and bit lines are provided with a medium potential between these potentials. During reading it is easier, here, for example, one row is read out by connecting the word line allocated to this row of cells 116 to the pre-described read voltage or the pre-described read potential, while the word lines of all other rows are not connected. In the volatile operating mode, the read voltage is smaller than the write voltage, such that dipole preferential directions are not or only slightly affected.

It should be noted that the volatile operating mode of the 1T memory cell 116 as just described is actually only a partly volatile operating mode or a volatile operating mode where the stored information is maintained longer than in the above-described embodiments where the memory state is reflected in a state of charge, but not for so long that the same could be referred to as nonvolatile. The reason is that the dipole preferential direction is maintained longer than the state of charge of the above-mentioned capacitors. Thus, the operating mode described so far has the effect that the memory is just supplied with power and only low voltages are used, effectively as 1T DRAM replacement with lower but still necessitated refresh rate and a small memory window. This is enabled since low voltages do not strain the ferroelectric material too much. Here, the ferroelectric material is only operated in smaller hysteresis loops or a sub-loop regime, which merely results in a minimum stress of the interface in the MFIS-FET configuration. This results in a minimum deterioration of the interface 126 and high endurance.

If switching to the nonvolatile operating mode is necessitated, since one of the above described trigger conditions occur, this could take place in the following way.

Figure 16:
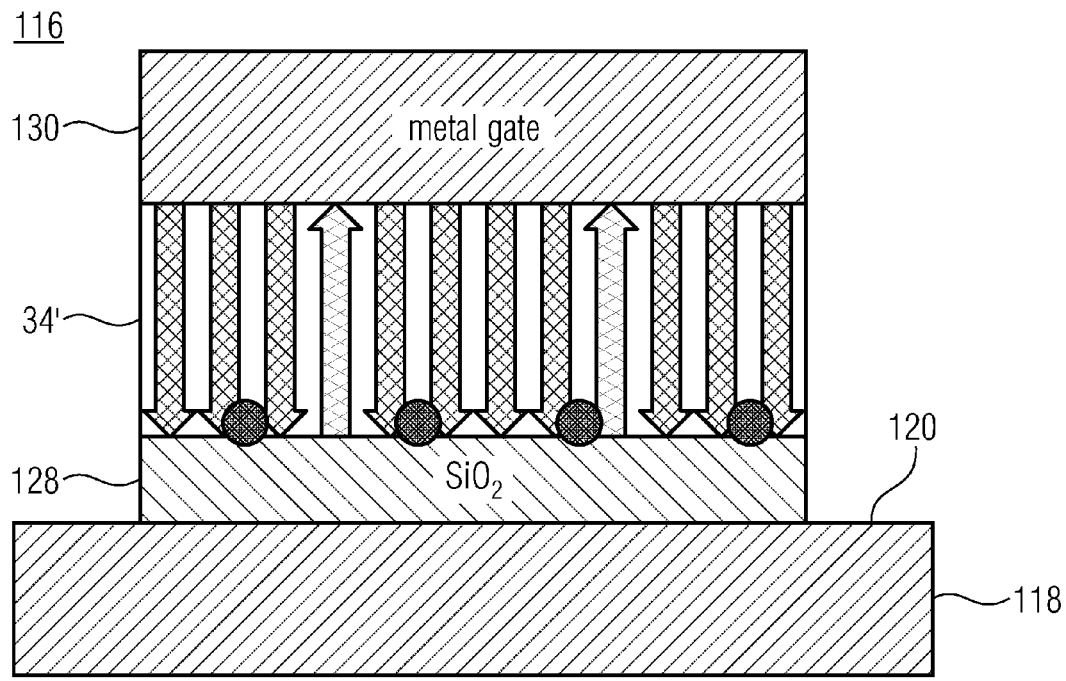
FIG. 16 is a schematic side view of the transistor of FIG. 12 with a state stored in a nonvolatile manner.

FIG. 16 shows, at first, a state stored in a nonvolatile manner corresponding to FIG. 14. In the nonvolatile operating mode, the stored state does not only correspond to a dipole preferential direction of an unstable type, but the state is stable. This is obtained by applying a higher voltage between gate electrode 130 and semiconductor material of the substrate 118 when writing information, e.g. a bit, such that the applied voltage results in a saturated polarization hysteresis in the ferroelectric material. In the exemplary case of an existing insulating layer 120, the voltage is so great that it effects a voltage drop across the layer 128 and the remaining voltage results in the stated saturated polarization hysteresis. Again, the voltage direction determines the stored state.

For performing a safe operation, the following could take place. First, the information stored in a volatile manner is read out from all cells. They only have to be latched for the save operation. When programming the nonvolatile state, this avoids entering of interference caused in the other cells into the area of the volatile operating mode and threatens the volatile, only saved, memory state. This means, under the exemplary assumption that the nonvolatile programming is performed at Vdd and a Vdd/3 disturb-inhibit operating scheme is used for the neighboring cells, the neighboring cells still experience a voltage of Vdd/3, which would then approximately correspond to Vdd/3 or Vdd/2 or 2Vdd/3, which had been used for regular programming of the volatile mode. Alternatively, it would be possible to find operating voltages that avoid in another way that during saving a cell in the nonvolatile mode, a still volatile mode or memory state of a neighboring cell is threatened. After reading out the memory state to be saved, for example, the stored value is written back into the cells in a nonvolatile manner word line by word line, which actually happens, as in the volatile operating mode, merely with higher voltages; the word line and hence the gate electrode 130 of the memory cells of the currently written row is connected to a very high potential, while all other word lines are connected, for example, to a medium potential which is higher than for the volatile mode. Memory cells of the current row into which a first bit value is to be written back, are connected to the very high potential and the others to a low potential, such that in the latter the information to be stored ends in a remanent polarization in a nonvolatile manner, whereupon the word line is connected to the other potential to write the other cells. If a restore operation is to be initiated, triggered by examples as described above, this can again take place in a similar manner as described above with reference to the volatile operating mode; the gate electrode 130 is connected to a potential and at the same time current measurement is performed via the channel or between drain and source terminal of the transistor 116, and only when the permanent polarization points into the clear direction, the current value exceeds a threshold and otherwise not, which enables conclusions on the stored value. This read-out value can then again be written back to the cell 116 into the volatile operating mode.

Entering the nonvolatile operating mode, i.e. the save operation, can be performed at triggering conditions, as described above with reference to FIG. 2, and the same applies accordingly to trigger conditions for a restore operation. For example, the nonvolatile operating mode is activated when a power supply of the memory ends. Permanent storage of the memory state in the cell 116 is effected, as already mentioned, by a high voltage pulse at the ferroelectric material-based FET 116. The memory state is stored with good and temperature-resistant endurance and a large memory window.

Figure 17:
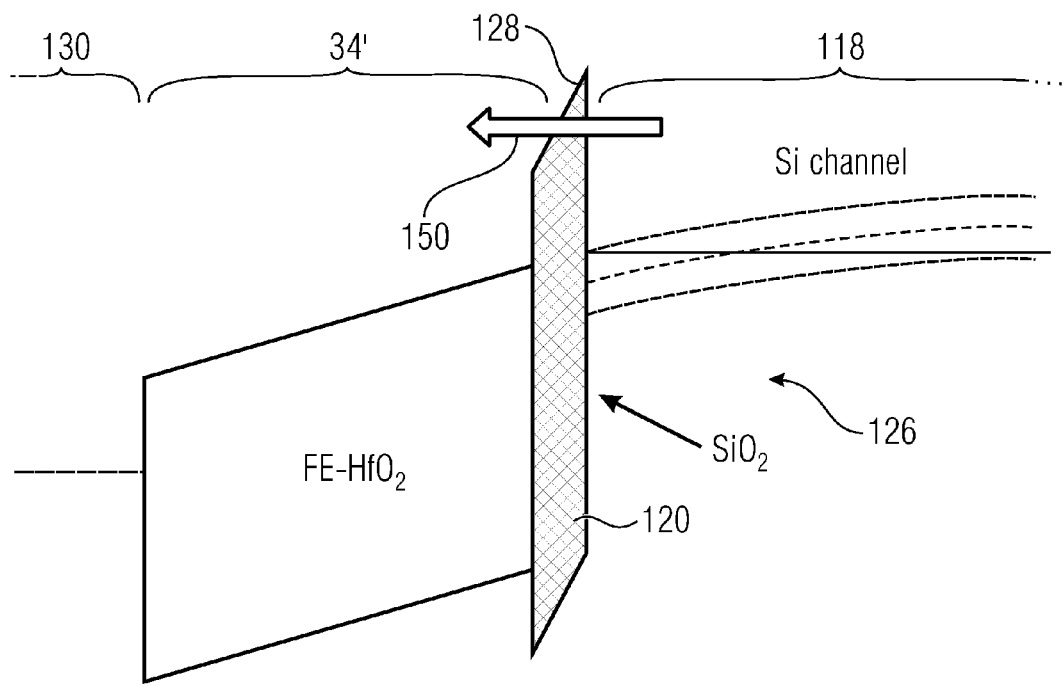
FIG. 17 is a schematic illustration of the band model between gate electrode and channel of the transistor of FIG. 14 with the state stored in a nonvolatile manner.

FIG. 17 shows a possible explanation for this; due to the higher used voltages for writing, charge carrier injection from the channel 126 into the ferroelectric material 34' takes place, through the insulating layer 128, as indicated in FIG. 17 by arrow 150, and this injection can result in a mutual amplification of the aligned dipole in the material 34'. The high fields across the MFIS-FET applied during writing do not only have the effect that a saturated polarization loop is passed during writing, but additionally also stabilizes the polarization state by charge injection 150. It should be noted that the latter effect is only one possible explanation, but that possible the stability of the polarization state also results when no charge injection 150, as described based on FIG. 17, takes place.

However, the stored state is stable due to the high write voltages used. Reading these stored states can be performed with a different or the same voltage at the gate electrode 130.

Concerning the embodiments of FIGS. 12 to 17, it should be noted that the implementation with word lines and bit lines was merely exemplary. Different memory configurations with other terminals could also be used. Arranging the cells into a field, for example, is merely optional. The latter generalization applies accordingly to embodiments of FIGS. 1 to 11.

In the embodiments of FIGS. 12 to 17, a voltage across the information storage element increased with respect to the volatile operating mode has been used for writing in the nonvolatile operating mode, namely such that the voltage across the information storage element in the nonvolatile operating modes results in a saturated polarization hysteresis and in the volatile operating mode only in an unsaturated polarization hysteresis. The write voltage in the volatile mode is adjusted, for example, such that a field strength smaller than or equal to $a_1 \cdot E_c$ ($E_c$=coercive field strength) results in the ferroelectric material, and is adjusted in the nonvolatile mode such that a field strength of greater than or equal to $a_2 \cdot E_c$ ($E_c$=coercive field strength) results in the ferroelectric material. $a_1$ and $a_2$ are factors selected, for example, in dependence on the ferroelectric material and the abruptness ($P_r/P_s$ ratio, i.e. ratio between remanent and spontaneous polarization) of the hysteresis behavior of the same. For example, $1.2 < a_1 \leq a_2 < 2$ is selected. Additionally or alternatively, $a_2 - a_1$ can, for example, be greater than $0.5 \cdot E_c$. In particular, for example, $a_1 = 1.5$ and $a_2 = 2$.

Concerning the storage capacitor 80, it should still be noted that it is obvious that, in the case of a power supply breakdown, the same is decoupled from an external supply voltage line, for example by a diode or the same not illustrated in more detail, in order to avoid that the charge on this capacitor 80 is lost and flows out of the memory 44, since the energy or charge contained therein is provided for performing the described save operations at the memory cells.

Figure 18:
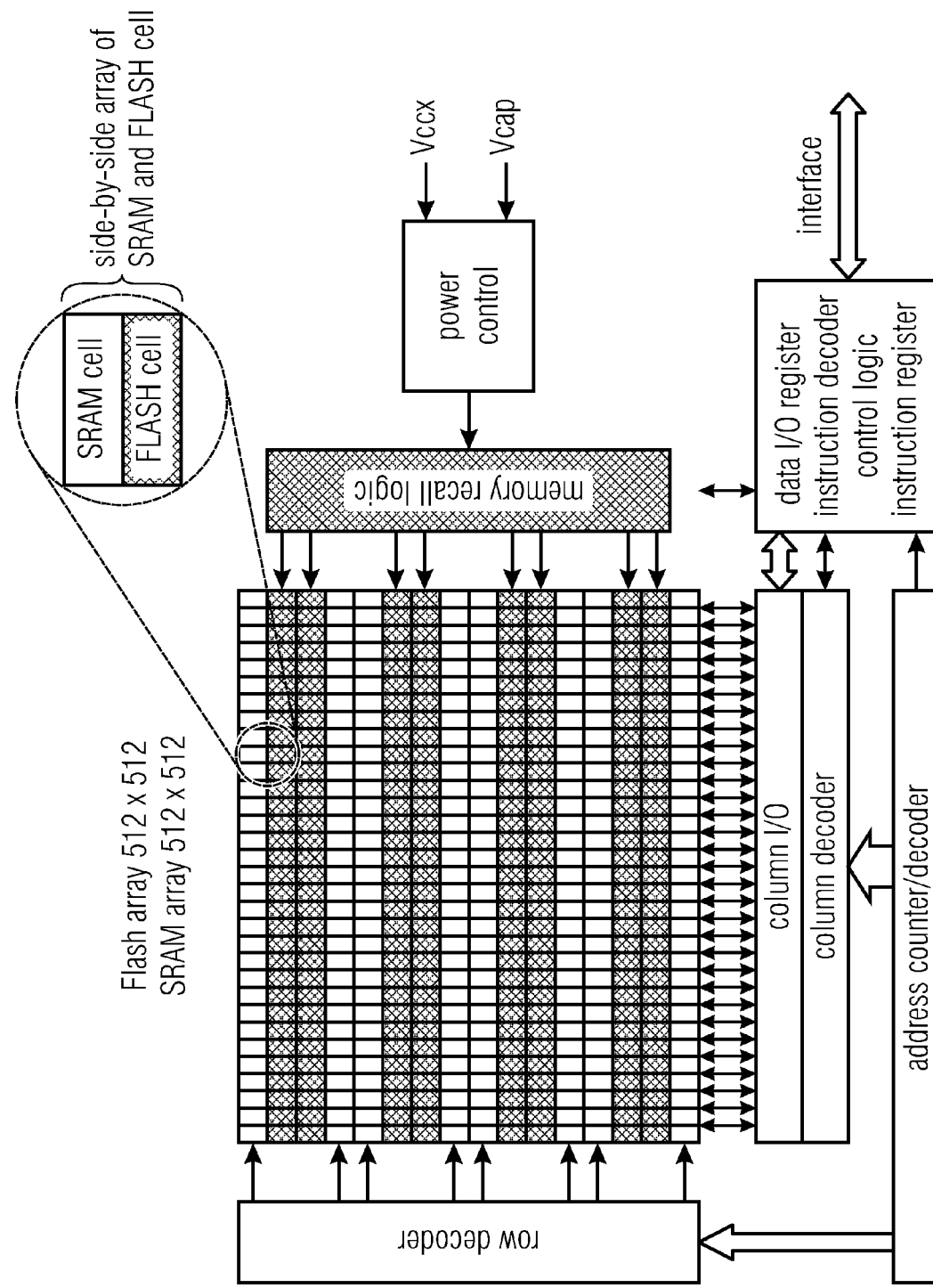
FIG. 18 is schematic block diagram of a memory with a doubling of SRAM cell and flash cell per cell position.

In summary, the above embodiments described a semiconductor based memory cell and a memory including such cells. The above embodiments could be implemented in an environment as illustrated in FIG. 18, but without the additional effort of the double structure per cell. The storage restore control and the power control together with emergency high energy storage capacitors would control the save and restore operations described above.

Concerning FIGS. 6 and 11, it should still be noted that the voltage values indicated exemplarily are, for example, advantageous for layer thicknesses of the ferroelectric materials that are at approximately 10 nm.

It applies to all embodiments that the respective cell can be operated in a volatile manner and with high endurance of a DRAM at low power, whereas, when necessitated, nonvolatile operation is enabled by using high-voltage ferroelectric switching.

It is an advantage of all embodiments that hafnium and/or zirconium oxide based systems can be provided with ferroelectricity, since these are materials that are used already extensively in their paraelectric state in conventional memory systems, such as DRAM. This allows the design of the above embodiments, such as DRAM/FeRAM having a volatile an a nonvolatile operating mode without necessitating additional NVM elements.

Among others, a memory cell having a capacitance, such as a capacitor or a capacitance between gate and channel of an FET has been described as information storage elements, wherein the dielectric medium of the information storage element comprises a ferroelectric material, wherein the memory cell is able for an operating mode that is volatile and a further operating mode that is nonvolatile, wherein switching between these two modes is possible. Here, the cell can be implemented to effect a change of an operating mode by changing the operating voltage across the information storage element.

Finally, it should be noted that the above embodiments are not limited to a specific technology. For example, an implementation deviating from a typical FRAM embodiment could, for example, also do without separate plate lines. In this respect, reference is made to, for example, Braun et al. "A Robust 8F2 Ferroelectric RAM Cell with Depletion Device (DeFeRAM)" IEEE Journal of Solid-State Circuits, Vol. 35, No. 5, May 2000.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

LIST OF ABBREVIATIONS

SRAM Static random access memory
DRAM Dynamic random access memory
IC Integrated circuit
ReRAM Resistive random access memory
STT-MRAM Spin-Transfer-Torque magnetic random access memory
PC-RAM phase change random access memory
NVM Nonvolatile memory
ALD Atomic layer deposition
PVD Physical vapor deposition
CVD Chemical vapor deposition
MFM Metal-ferroelectric-metal
FRAM Ferroelectric random access memory
MFIS Metal-Ferroelectric-Insulator-Semiconductor
MoL mid of line
BEoL back end of line

The invention claimed is:

1. Memory cell comprising an information storage element comprising a ferroelectric material, wherein the memory cell comprises a volatile operating mode and a nonvolatile operating mode,
    wherein the memory cell is implemented to use, in the nonvolatile operating mode, an operating voltage across the information storage element that is increased with respect to the volatile operating mode, such that
        in the nonvolatile operating mode, an electric coercive field strength of the ferroelectric material is exceeded, and in the volatile operating mode, the electric coercive field strength of the ferroelectric material is not exceeded, or
        the operating voltage across the information storage element in the nonvolatile operating mode results in a saturated polarization hysteresis and in the volatile operating mode only in an unsaturated polarization hysteresis.

2. Memory cell according to claim 1, wherein the memory cell is implemented to use the operating voltage, which is increased in the nonvolatile operating mode with respect to the volatile operating mode, for writing/reading.

3. Memory cell according to claim 1, wherein the information storage element comprises a capacitor, wherein the ferroelectric material forms a dielectric of the capacitor.

4. Memory cell according to claim 3, wherein, in the volatile operating mode, a memory state of the information storage element is defined by a state of charge of the capacitor, and, in the nonvolatile operating mode, a memory state of the information storage element is defined by a polarization state of the ferroelectric material.

5. Memory cell according to claim 2, wherein the memory cell further comprises a word line transistor.

6. Memory cell according to claim 5, wherein the memory cell is implemented to perform reading of a memory state of the information storage element via destructive sensing of a state of charge of the capacitor with subsequent writing back of the sensed state of charge.

7. Memory cell according to claim 1, wherein the information storage element is a transistor, wherein the ferroelectric material is arranged in a region between a gate electrode and an FET channel of the transistor.

8. Memory cell according to claim 7, wherein, in the volatile operating mode, a memory state of the information storage element is defined by a dipole preferential direction in the ferroelectric material, and, in the nonvolatile operating mode, the memory state of the information storage element is defined by a polarization state of the ferroelectric material.

9. Memory cell according to claim 7, wherein the memory cell is implemented to perform reading of a memory state of the information storage element via destruction-free sensing of a conductivity of the FET channel determined by a polarization state of the ferroelectric material.

10. Memory with a memory cell according to claim 1, wherein the memory is implemented to switch, in response to a trigger event, from the volatile operating mode into the nonvolatile operating mode and to save a state stored in the volatile operating mode in the nonvolatile operating mode.

11. Memory according to claim 10, wherein the trigger event is a memory voltage supply breakdown and/or indications of an imminent supply voltage breakdown.

12. Memory according to claim 10, wherein the memory is implemented to read a memory state of the memory cell in response to a restart in the nonvolatile operating mode, and to switch to the volatile operating mode in order to restore the read memory state in a volatile manner.

13. Method for operating a memory cell, which comprises an information storage element that comprises a ferroelectric material, wherein the method comprises an operation of the memory cell in a volatile operating mode and an operation of the memory cell in a nonvolatile operating mode, wherein, in the nonvolatile operating mode, an operating voltage across the information storage element that is increased with respect to the volatile operating mode is used, such that in the nonvolatile operating mode, an electric coercive field strength of the ferroelectric material is exceeded, and, in the volatile operating mode, the electric coercive field strength of the ferroelectric material is no exceeded, or the operating voltage across the information storage element in the nonvolatile operating mode results in a saturated polarization hysteresis, and in the volatile operating mode only in an unsaturated polarization hysteresis.

\* \* \* \* \*